(12) United States Patent
Otis

(10) Patent No.: US 6,487,089 B1
(45) Date of Patent: Nov. 26, 2002

(54) ENHANCED ARRANGEMENT FOR SECURING TWO MATING COMPONENTS TOGETHER

(75) Inventor: Bruce P. Otis, Rochester, MN (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 09/531,668

(22) Filed: Mar. 20, 2000

(51) Int. Cl.⁷ .............................. H05K 7/14; H05K 7/18
(52) U.S. Cl. .................. 361/796; 361/797; 361/727; 361/801; 361/802; 361/825; 361/759; 211/41.17; 211/4.02; 220/4.02
(58) Field of Search ................................. 361/752, 796, 361/756, 759, 825, 807, 810, 785, 753, 802, 801, 727, 741, 683, 724, 788, 797; 211/41.17; 220/4.02

(56) References Cited

U.S. PATENT DOCUMENTS

| | | | | |
|---|---|---|---|---|
| 5,601,349 A | * | 2/1997 | Holt | 312/265.6 |
| 5,640,309 A | * | 6/1997 | Carney et al. | 361/801 |
| 5,694,291 A | * | 12/1997 | Feightner | 361/683 |
| 5,738,226 A | * | 4/1998 | Dean | 211/41.17 |
| 5,751,558 A | * | 5/1998 | Gullicksrud et al. | 361/801 |
| 5,936,835 A | * | 8/1999 | Astier | 361/683 |
| 6,215,668 B1 | * | 4/2001 | Hass et al. | 361/759 |
| 6,278,614 B1 | * | 8/2001 | Beaman et al. | 361/752 |

* cited by examiner

Primary Examiner—David Martin
Assistant Examiner—Thanh Yen Tran
(74) Attorney, Agent, or Firm—Rabin & Berdo, PC; Robert H. Berdo, Jr.

(57) ABSTRACT

An arrangement includes a chassis, and a first mating component disposed inside of the chassis. A second mating component is provided. The first mating component is removably connected to the second mating component. A sliding tab is connected to the chassis and is slidable in a linear direction from a first position to a second position. When the sliding tab is in the first position, the first mating component is free to be removed from the second mating component. When the sliding tab is in the second position, the first mating component is secured to the second mating component to prevent the removal of the first mating component from the second mating component.

31 Claims, 11 Drawing Sheets ature, there is a need for an arrangement that will allow a user to determine if a circuit board is secured to a backplane, without accessing the inside of the chassis.

ENHANCED ARRANGEMENT FOR SECURING TWO MATING COMPONENTS TOGETHER

BACKGROUND OF THE INVENTION

1. Field of the Invention

The invention relates to an enhanced arrangement for securing two mating components together, such as a backplane and a circuit board of a computer, and in particular, to an enhanced arrangement that allows a circuit board to be secured to a backplane without using any tools.

2. Background Information

Computer systems typically have internal mating components that are disposed within a chassis. For example, it is known to place an assembly, including a backplane and various circuit boards, such as a processor card and a so-called memory riser card, within an open chassis. This forms a so-called central electronics complex (CEC) of a computer system. The chassis is subsequently disposed within a computer housing, for example.

The chassis serves to position the circuit boards in a predefined configuration, and acts as an EMC (electromagnetic compatible) shield. An EMC shield is a shield which allows operation in an electromagnetic environment at an optimal level of efficiency, and which allows static charges to be drained to a frame ground. Moreover, the chassis helps to protect the components contained therein from environmental damage, for example, vibrations, which could cause the components to fail.

The backplane, which is wiring board, is typically provided with one or more card slots for the various circuit boards. The respective circuit boards may be removably coupled to the backplane by inserting a corresponding plug connector on the circuit board into the associated backplane card slot. The circuit boards are then held in place using various known means.

For example, each individual circuit board may have a tailstock disposed on a rear edge thereof. As is known, a tailstock is a plate that provides physical support for the associated electrical device (for example, the circuit board), and which may provide for a limited amount of electromagnetic radiation shielding in some situations. Typically, the tailstock is fastened to the chassis using a threaded fastener, such as a screw or bolt, thus securing the associated circuit board. This helps to prevent vibrations or other environmental forces from causing the respective circuit boards from disengaging with the associated card slots of the backplane, which would otherwise cause the circuit boards to become non-functional.

However, as will be appreciated, conventionally a tool is required to remove and/or install the threaded fastener. For example, if a circuit board is to be removed and disengaged from the backplane, a screwdriver may be required to first remove the screw that holds the tailstock of the respective circuit board to the chassis. While this may not present an insurmountable obstacle during the manufacturing of the computer, today's computers are often modified by the end users. These end users may not have sufficient skill to utilize a screwdriver, or may not have a screwdriver in their possession. Moreover, even if the end user manages to remove the screw, he may inadvertently drop the removed fastener into an inaccessible portion of the chassis. Such a scenario would prevent the circuit board from be re-secured to the chassis until another screw could be obtained. Further, since the threaded fasteners are conventionally formed of a conductive metal, such as steel, the lost screw could cause an electrical short within the computer system.

Thus, there is a need for an arrangement that will allow a circuit board to be removably secured within a chassis without using threaded fasteners.

Further, there is a need for an arrangement that will allow a circuit board to be removably secured within a chassis without using any tools.

Additionally, there is a need for an arrangement that will prevent the inadvertent loss of the fastener used to secure the circuit board to the backplane.

It is also known to provide a tool-less arrangement that includes a number of moving parts attached to the chassis. As shown in FIG. 11, this known arrangement includes a pivotal flap 110 that is secured to a flap holder 112. The flap 110 can be pivoted to rest upon the tailstock 114. The arrangement further includes a handle 116 that can be rotated into engagement with the flap 110, so as to provide a clamping force, thereby securing the circuit board 118 in place. However, this known arrangement is relatively complex, and has numerous parts. Thus, this known arrangement is relatively expensive to manufacture. Therefore, there is a need for a tool-less arrangement that will secure, for example, a circuit board to a backplane, using a simple and uncomplicated configuration.

Furthermore, with the known arrangements used for securing a circuit board to a backplane, it is difficult to determine if the circuit board is properly secured without first removing or otherwise accessing the chassis. That is, the handle and flap of the conventional tool-less arrangement, as well as the conventional threaded fasteners, are disposed within the chassis, and cannot be viewed until the interior of the chassis is accessed. This is a labor intensive operation, and is unlikely to be performed unless a problem has indicated that a circuit board has already moved out of engagement with the backplane. Thus, there is a need for an arrangement that will allow a user to determine if a circuit board is secured to a backplane, without accessing the inside of the chassis.

Additionally, it is also typical to provide the backplane with extra card slots, i.e., card slots that are not populated by circuit boards when the computer is first sold. This allows the end user to populate the computer with circuit boards after the initial purchase, for example, so as to allow the end user to tailor the configuration of the computer to meet specific needs. However, in conventional computer systems, it may be difficult to determine if there are any empty card slots available, without first gaining access to the interior of the chassis. Thus, there is a need for an arrangement that will allow a user to determine if there are any empty card slots on the backplane, without accessing the inside of the chassis.

SUMMARY OF THE INVENTION

It is, therefore, a principle object of this invention to provide an enhanced arrangement for securing two mating components together.

It is another object of the invention to provide an enhanced arrangement for securing two mating components together that solves the above mentioned problems.

These and other objects of the present invention are accomplished by the enhanced arrangement for securing two mating components together disclosed herein.

According to one aspect of the invention, a sliding tab is provided that is insertable into a chassis of a computer system so as to secure a printed circuit board, for example, in a desired position. The sliding tab projects through an opening formed in the chassis, so that a front portion of the sliding tab is disposed inside of the chassis, and a rear portion of the sliding tab is positioned generally outside of the chassis. Although other arrangements of the sliding tab are within the scope of the present invention, this particular configuration advantageously allows the rear portion of the sliding tab to be seen and grasped by a user, and allows the front portion of the sliding tab to engage with a tailstock of the circuit board.

The sliding tab according to an exemplary aspect of the invention has a relatively thin, elongated configuration. The front portion of the sliding tab is tapered toward a front edge thereof, and is configured to slope upwards toward the rear portion of the sliding tab. Moreover, the front portion is slightly thinner than a thickness of a central portion and rear portion of the sliding tab. This configuration advantageously provides the front portion of the sliding tab with some resiliency. Further, a step is formed at a junction between a lower surface of the front portion and a lower surface of the central portion, which advantageously provides for a recessed area that accommodates the tailstock of the circuit board.

In another exemplary aspect of the invention, the rear portion of the sliding tab may be provided with a textured surface to facilitate gripping of the sliding tab. Thus, the user will advantageously be able to pull the sliding tab in a reverse direction without losing his grip.

In a further exemplary aspect of the invention, in order to retain the sliding tab within the opening in the chassis, the central portion of the sliding tab may be provided with an elongated slot. A retaining tab may then be disposed on a lower periphery of the opening, and tailored so as to extend across the opening. The retaining tab projects through the elongated slot, and helps to guide the sliding tab in a forward and reverse direction. Moreover, the retaining tab limits an amount of movement of the sliding tab in a forward, reverse and side-to-side direction in a simple and effective manner.

The sliding tab may have a retaining projecting lip on the front edge of the front portion. The retaining projecting lip advantageously serves to ensure the sliding tab slides over the tailstock, rather than under the tailstock. Moreover, the retaining projecting lip advantageously provides a surface that will abut against the chassis or other retaining member to prevent the sliding tab from being inadvertently removed from the opening, i.e., to ensure that the sliding tab is not pulled all the way through the opening.

In a further aspect of the invention, the interior of the chassis includes a shelf that projects away from the opening, and which is essentially level with a lower peripheral edge of the opening. When the sliding tab is installed in the chassis, the front portion of the sliding tab rests upon the shelf. The shelf thus advantageously provides support for the sliding tab.

In order to secure the sliding tab to the chassis and prevent the accidental loss or removal of the sliding tab, the chassis may include a bracket that is provided over the front portion of the sliding tab, so that the sliding tab is sandwiched between the shelf and the bracket. Moreover, in an exemplary embodiment, the bracket is formed from sheet metal, and at least partially covers the opening. The bracket can thus act as an EMC shield, and limit electromagnetic radiation emissions through the opening.

The bracket may also extend over the front portion of the sliding tab, and essentially parallel to the shelf. The bracket thus advantageously prevents the sliding tab from being lifted or moved in an upward direction, and consequently prevents the sliding tab from being removed from its engagement with the retaining tab.

According to an exemplary aspect of the invention, due to the sloping configuration of the front portion of the sliding tab, as the sliding tab is pushed in, the engagement between the upper surface of the front portion and the bracket will cause the front portion of the sliding tab to be urged, with a progressively increasing force, downward and toward the upper flange portion of the tailstock. When the sliding tab is fully pushed in, the sliding tab will thus exert a maximum downward force against the upper flange portion of the tailstock, thus securing the circuit board to the backplane.

Further, when the sliding tab is fully pushed in, the upper flange portion of the tailstock will be advantageously accommodated in the recessed area of the front portion of the sliding tab, i.e., under the sliding tab. This helps to distribute the force applied by the sliding tab over a large area of the upper flange portion, rather than concentrated in only one location.

DETAILED DESCRIPTION OF THE PREFERRED EMBODIMENTS

The invention will now be described in more detail by way of example with reference to the embodiments shown in the accompanying figures. It should be kept in mind that the following described embodiments are only presented by way of example and should not be construed as limiting the inventive concept to any particular physical configuration.

Further, if used and unless otherwise stated, the terms "upper", "lower", "front", "back", "over", "under", and similar such terms are not to be construed as limiting the invention to a particular orientation. Instead, these terms are used only on a relative basis.

Figure 1:
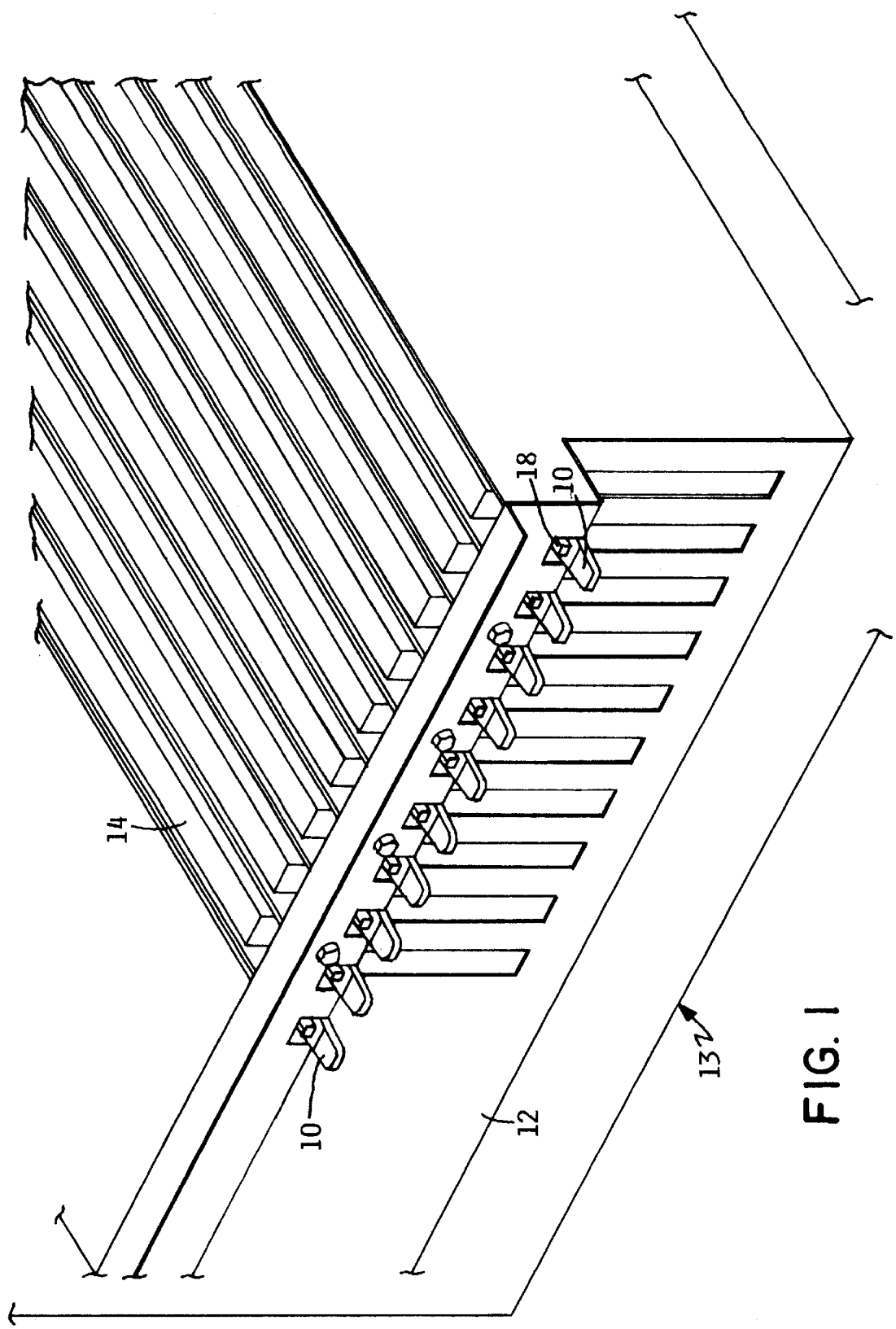
FIG. 1 is a perspective partial view of a tool-less configuration for securing a circuit board within a chassis, according to an exemplary embodiment of the present invention.
Figure 2:
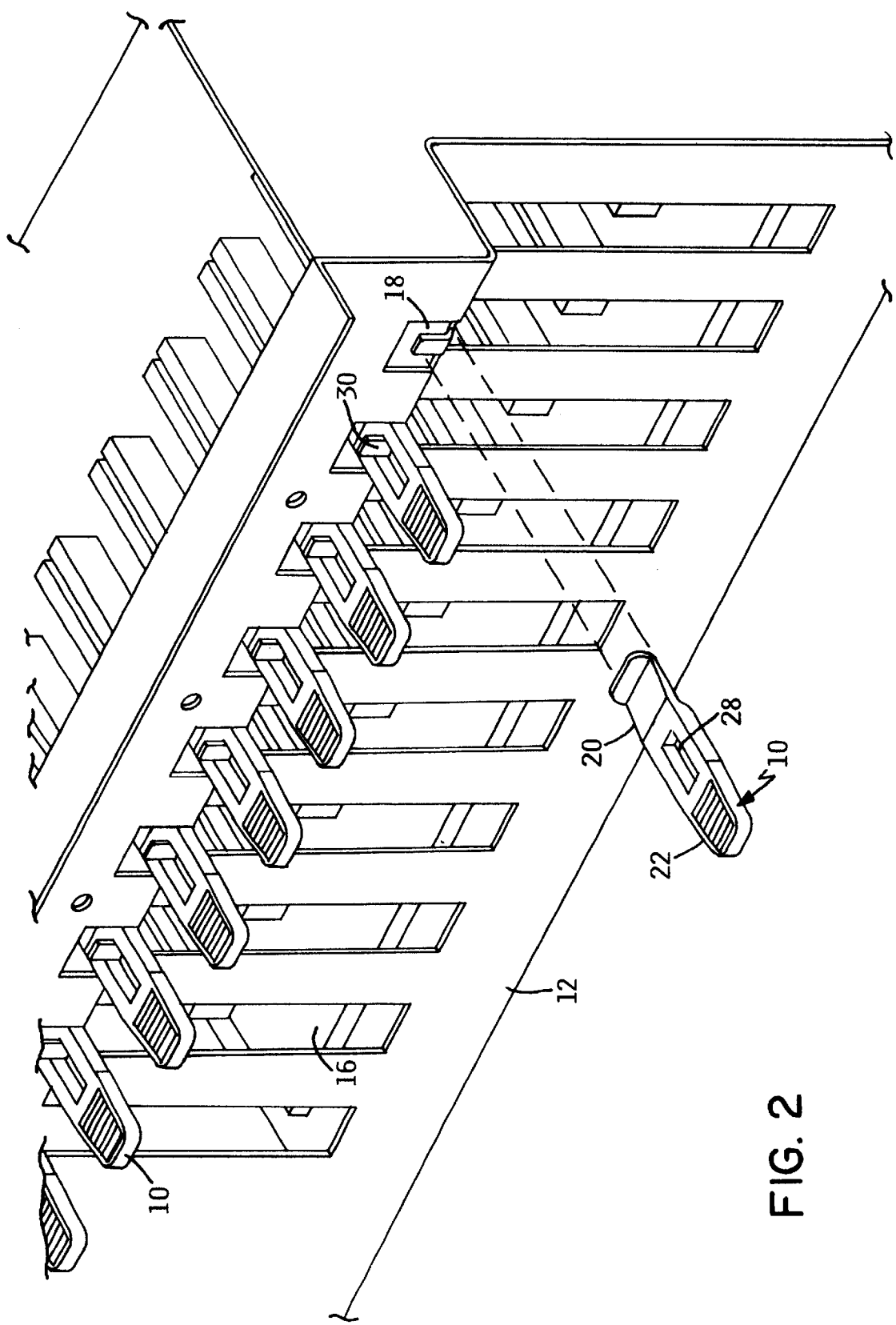
FIG. 2 is a perspective partial view of the configuration shown in FIG. 1, illustrating the insertion of a sliding tab into an opening in the chassis.

FIGS. 1 and 2 illustrate an exemplary embodiment of the invention, which includes a sliding tab 10 that is insertable into a chassis 12, which may be disposed within a housing 13 (shown only schematically in FIG. 1) of a computer system (not shown). The invention may be used to secure a printed circuit board 14, for example, in a desired position, within the chassis 12. For example, in the illustrated exemplary embodiments, the sliding tab 10 secures the printed circuit board 14 to a backplane 16. However, the present invention may also be utilized in other applications, for example, to secure any mating components together.

Moreover, in the following discussion, the present invention is described in connection with one exemplary sliding tab. However, as will be appreciated, and as shown in the drawings, it is contemplated that the present invention may include a plurality of sliding tabs, each of which is used to secure an individual circuit board in a desired position. Moreover, it may be desirable, in some situations, to use two or more sliding tabs per component to be secured. These various arrangements are all within the scope of the present invention.

Further, the chassis 12 in the exemplary illustrated embodiment is not to be interpreted as having any particular configuration or size. That is, the chassis may be open or closed, disposed within a larger frame or alternatively be an outermost cage of the computer, or have any other configuration without departing from the spirit of the invention.

As shown, the sliding tab 10 projects through an opening 18 formed in the chassis 12, so that a front portion 20 of the sliding tab is disposed inside of the chassis, and a rear portion 22 of the sliding tab is positioned generally outside of the chassis. Although other arrangements of the sliding tab 10 are within the scope of the present invention, this particular configuration advantageously allows the rear portion 22 of the sliding tab to be seen and grasped by a user, and allows the front portion 20 of the sliding tab to engage with a tailstock (not shown in FIGS. 1 and 2) of the circuit board 14, as will be discussed in more detail in the paragraphs that follow.

Figure 3:
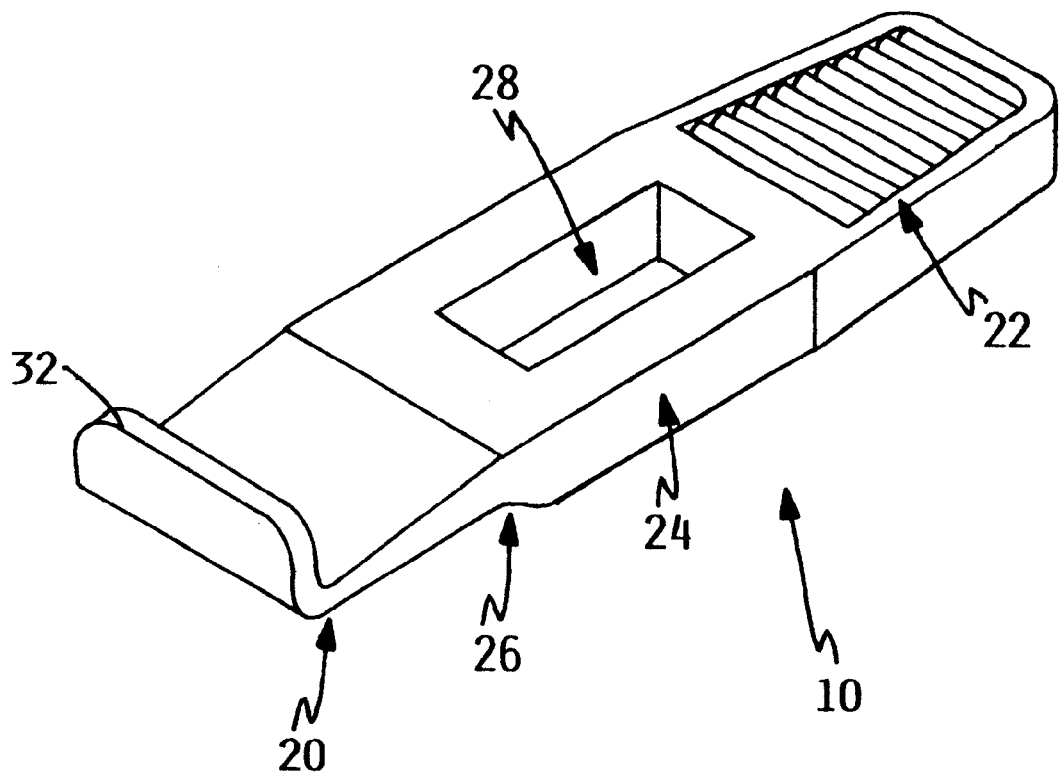
FIG. 3 is a perspective view of the sliding tab shown in FIG. 1.

As shown in FIG. 3, the sliding tab 10 according to an exemplary embodiment, has a relatively thin, elongated configuration. The front portion 20 of the sliding tab 10 is tapered toward a front edge thereof, and is configured to slope upwards toward the rear portion 22 of the sliding tab. Moreover, the front portion 20 is slightly thinner than a thickness of a central portion 24 and the rear portion 22 of the sliding tab 10. This configuration provides the front portion 20 of the sliding tab 10 with some resiliency, allowing the front portion to flex as it is slid over the component to be secured. Further, a step 26 is formed at a junction between a lower surface of the front portion 20 and a lower surface of the central portion 24, which advantageously provides for a recessed area that accommodates the tailstock of the circuit board, in a manner that will be more fully described.

The rear portion 22 of the sliding tab 10 may be provided with a textured surface to facilitate gripping of the sliding tab. Thus, the user will advantageously be able to pull the sliding tab 10 in a reverse direction without losing his grip.

Figure 4:
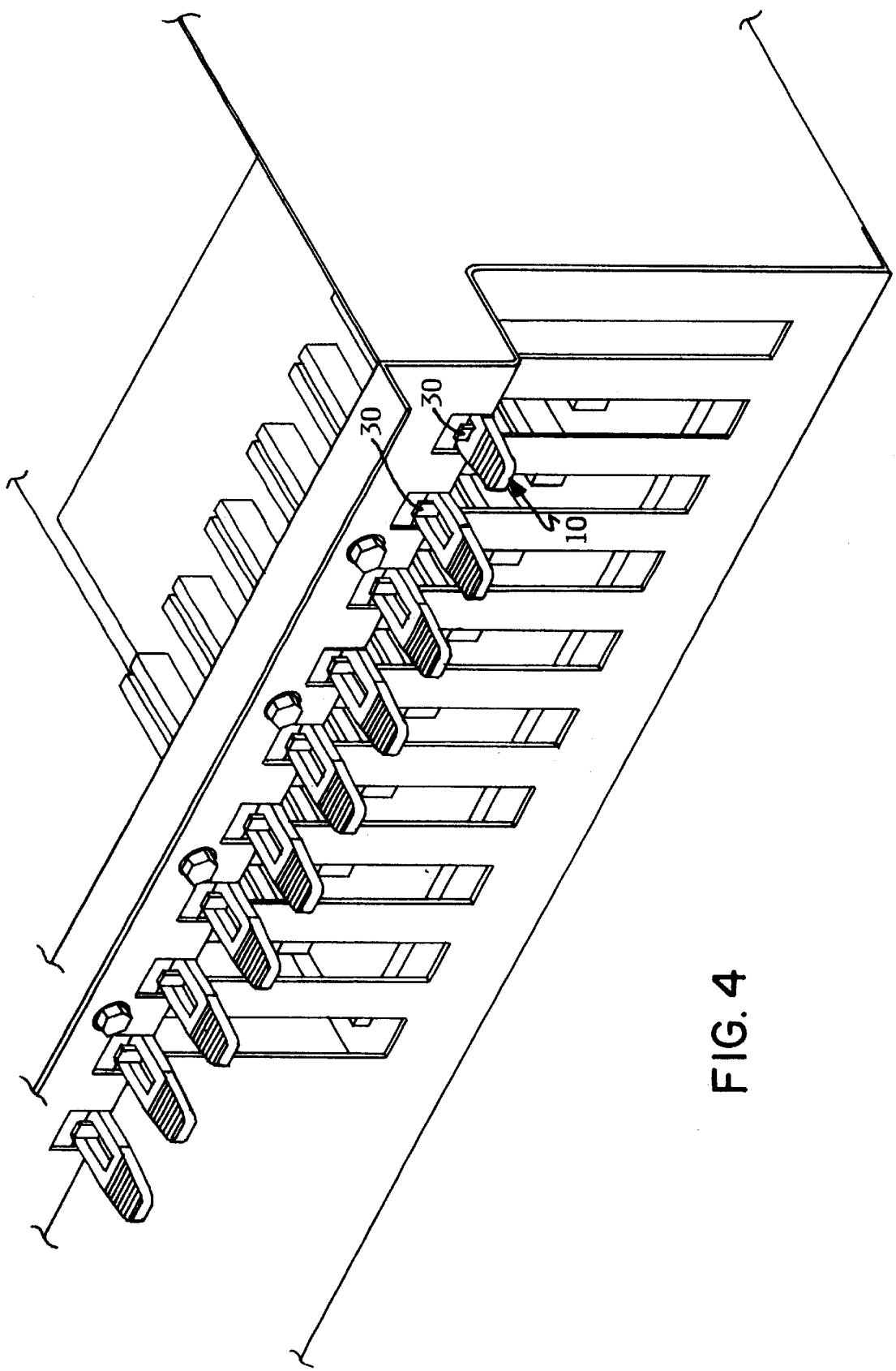
FIG. 4 is a perspective partial view of the configuration shown in FIG. 1, illustrating the far right sliding tab in a fully pushed in position, and the remaining sliding tabs in fully pulled out positions.

In order to retain the sliding tab 10 within the opening 18 in the chassis 12, the central portion 24 of the sliding tab is provided with an elongated slot 28. Referring briefly back to FIG. 2, a retaining tab 30 is disposed on a lower periphery of the opening 18, and is arranged to extend across the opening. The retaining tab 30 projects through the elongated slot 28, and guides the sliding tab 10 in a forward and reverse direction. Moreover, and as best shown in FIG. 4, the retaining tab 30 limits an amount of movement of the sliding tab 10 in a forward, reverse and side-to-side direction in a simple and effective manner.

In the illustrated exemplary embodiment shown in FIG. 3, the sliding tab 10 has a retaining projecting lip 32 on the front edge of the front portion 20. The retaining projecting lip 32 advantageously serves to ensure the sliding tab 10 slides over the tailstock, rather than under the tailstock. Moreover, the retaining projecting lip 32 advantageously provides a surface that will abut against the chassis 12 or other retaining member to prevent the sliding tab 10 from being inadvertently removed from the opening 18, i.e., to ensure that the sliding tab is not pulled all the way through the opening.

In an exemplary embodiment, the sliding tab 10 is formed from a non-conductive plastic material, such as LEXAN® polycarbonate resin manufactured by GE Plastics. However, the sliding tab 10 can also be formed of other materials without departing from the spirit of the invention.

Figure 5:
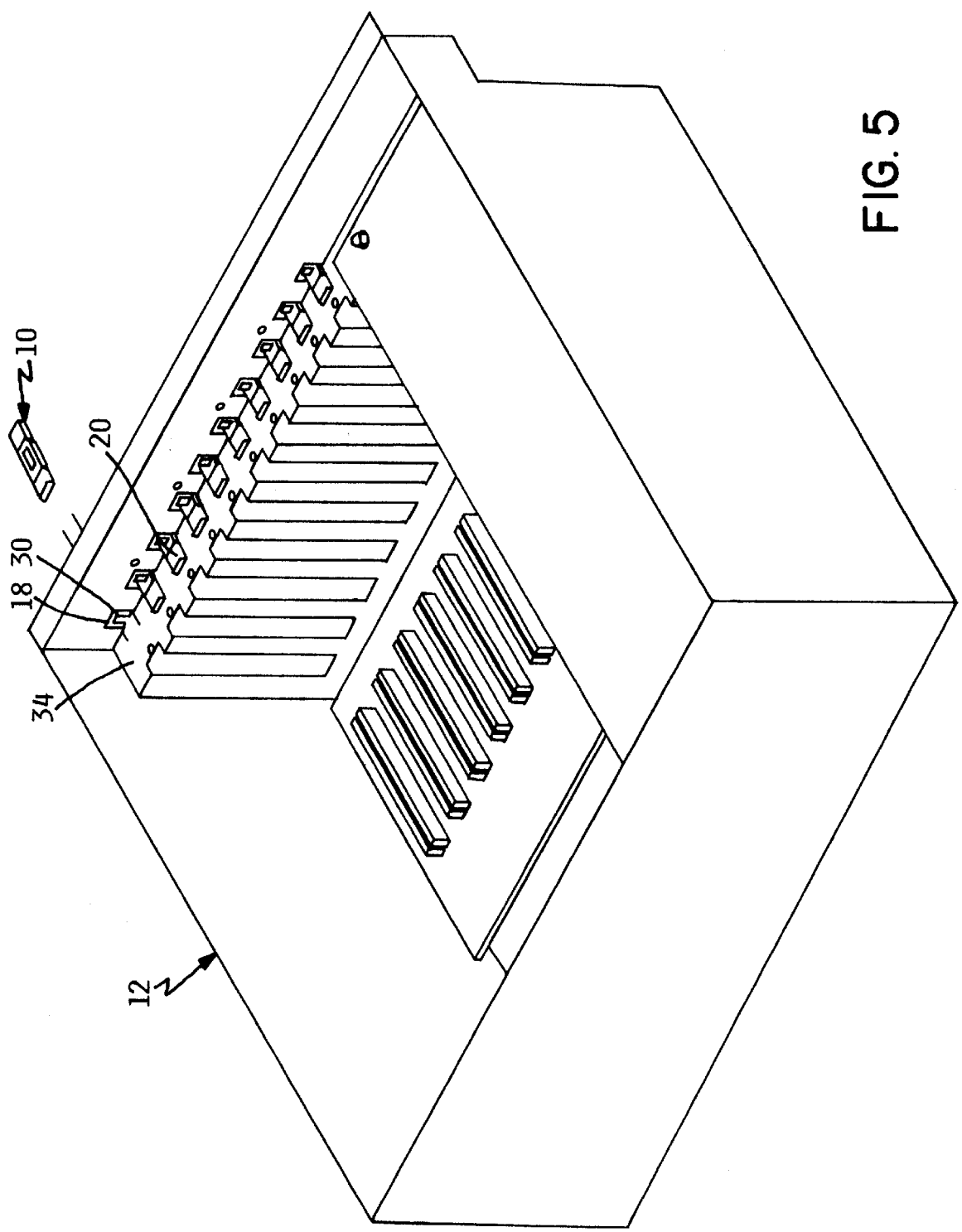
FIG. 5 is a perspective view of the insertion of a sliding tab into an opening in the chassis, similar to that shown in FIG. 2, but illustrating the configuration of an interior of the chassis.

As shown in FIG. 5, in an exemplary embodiment, the interior of the chassis 12 includes a shelf 34 that projects away from the opening 18, and which is essentially level with the lower peripheral edge of the opening. In the exemplary illustrated embodiment, the retaining tabs 30 are connected to an edge of the shelf 34. When the sliding tab 10 is installed in the chassis 12, the front portion 20 of the sliding tab rests upon the shelf 34. The shelf 34 thus provides support for the sliding tab 10.

Figure 6:
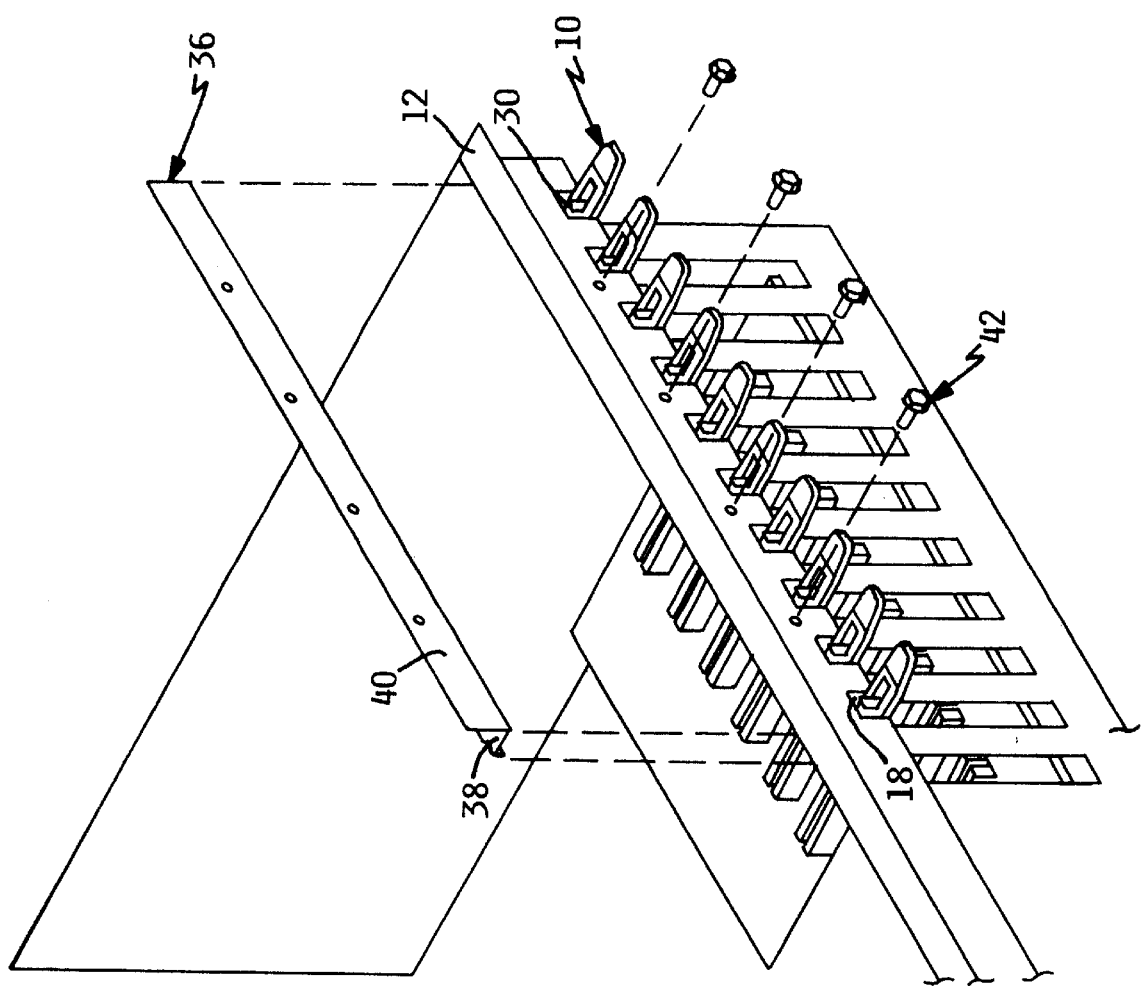
FIGS. 6 and 7 are perspective partial views of the configuration shown in FIG. 1, illustrating the installation of a bracket used to secure the sliding tabs to the chassis.
Figure 7:
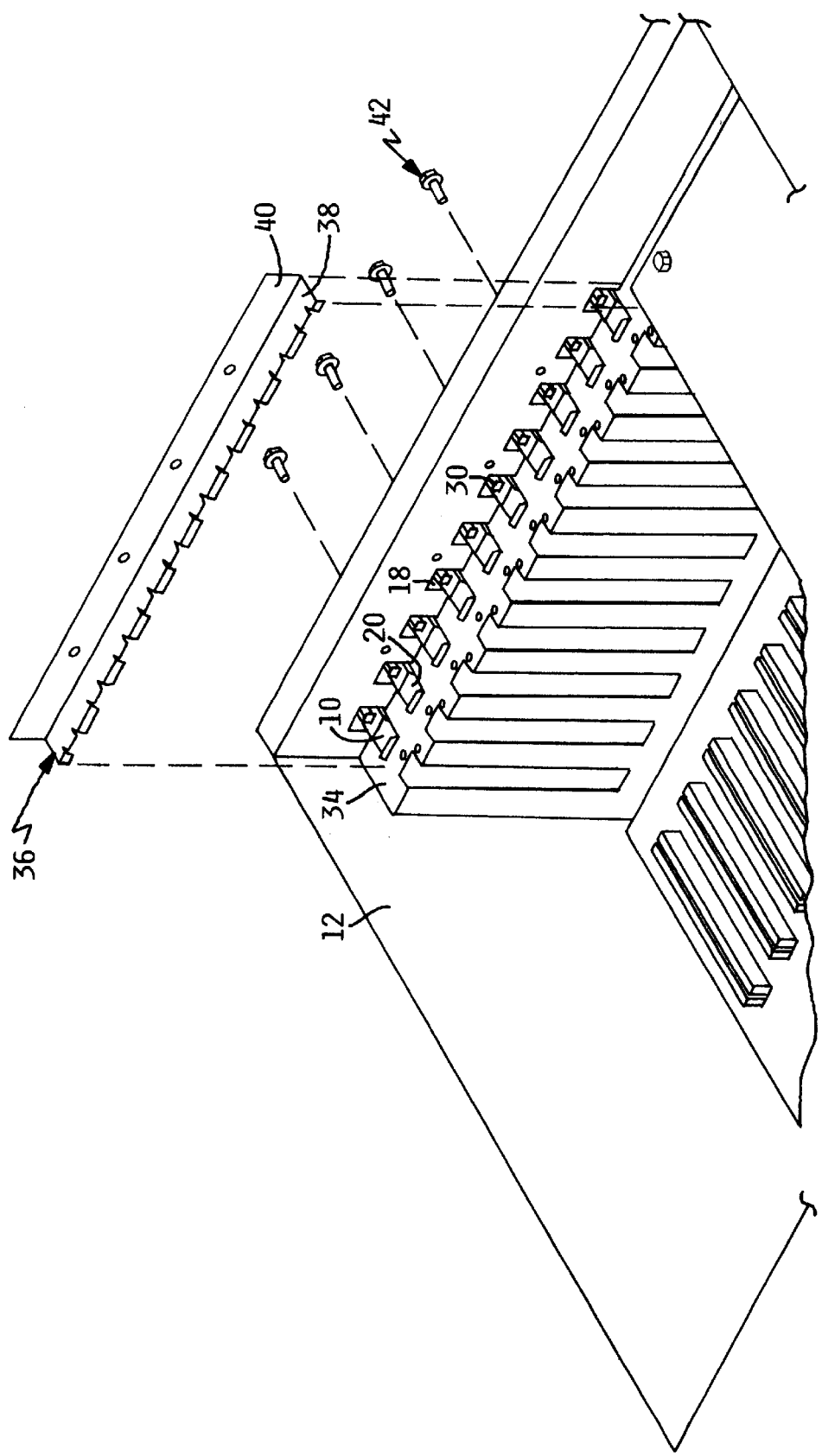

Referring to FIGS. 6 and 7, in order to secure the sliding tab 10 to the chassis 12 and prevent the accidental loss or removal of the sliding tab, the chassis includes a bracket 36 that is provided over the front portion 20 of the sliding tab, so that the sliding tab is sandwiched between the shelf 34 and the bracket 36. The bracket 36 has essentially an L-shaped cross-sectional profile defined by a lower leg portion 38 and an upper leg portion 40. The upper leg portion 40 is fastened to the chassis 12 in a conventional manner, for example, using threaded fasteners 42. Further, the bracket 36 is disposed on an inside wall of the chassis 12. Other configurations of the bracket 36, and other arrangements of fastening the bracket 36 to the chassis 12, are within the scope of the present invention.

Moreover, in an exemplary embodiment, the bracket 36 is formed from sheet metal. Further, preferably the upper leg portion 40 at least partially covers the opening 18. The upper leg portion 40 can thus act as an EMC shield, and limit electromagnetic radiation emissions through the opening 18.

The lower leg portion 38 of the bracket 36 extends over the front portion 20 of the sliding tab 10, and essentially parallel to the shelf 34. The lower leg portion 38 advantageously prevents the sliding tab 10 from being lifted or moved in an upward direction, and consequently prevents the sliding tab from being removed from its engagement with the retaining tab 30. Further, the lower leg portion 38 provides a bearing surface for the sliding tab 10.

Figure 8:
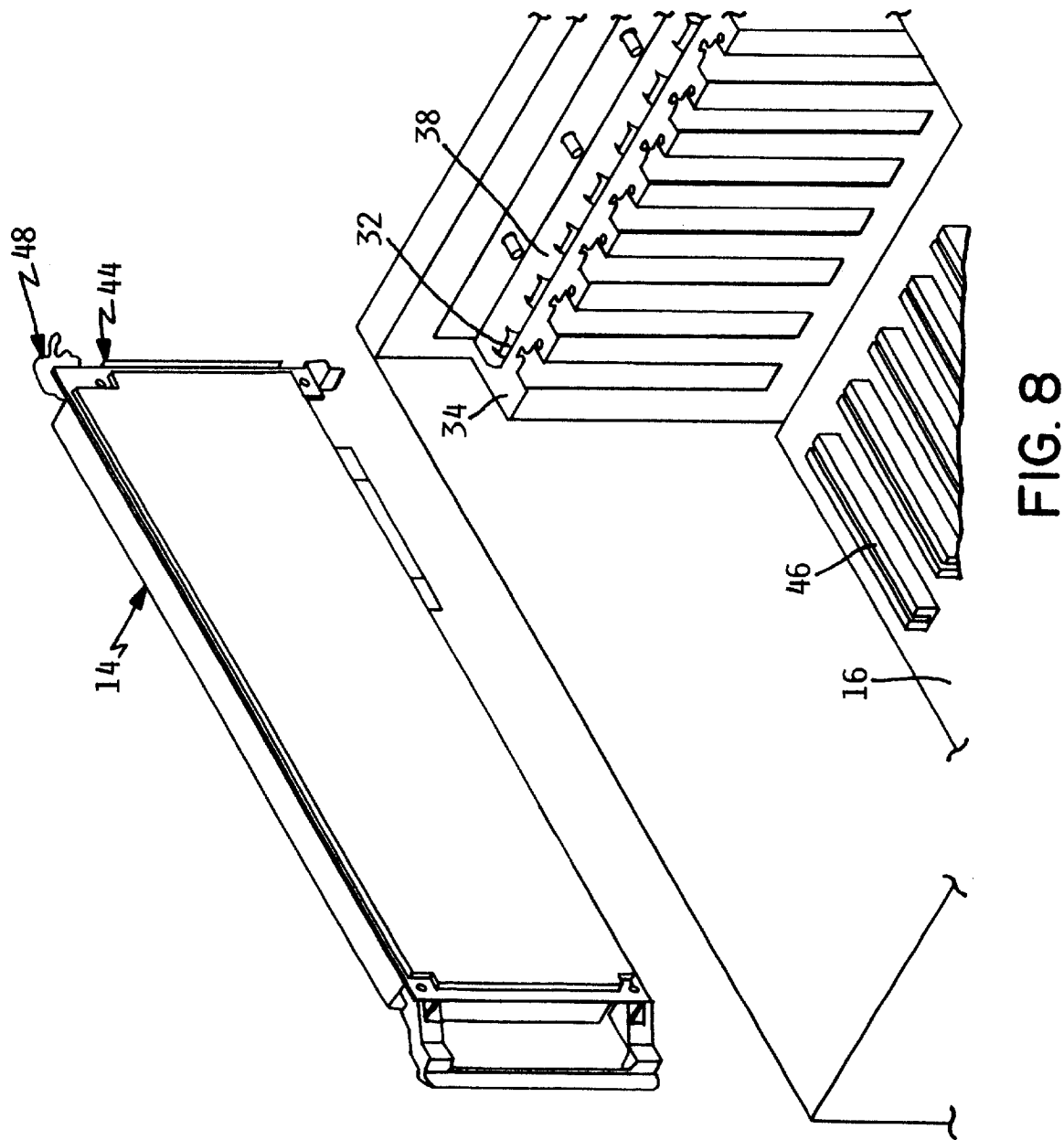
FIG. 8 is a perspective partial view of the configuration shown in FIG. 1, illustrating the insertion of a circuit board into the chassis, prior to engagement with a backplane.

Referring to FIG. 8, in order to secure, for example, the circuit board 14 to the backplane 16, the sliding tab 10 is pulled out a maximum amount, i.e., until the retaining projecting lip 32 abuts against the lower leg portion 38 of the bracket 36 and/or the retaining tab 30 is located at a first extreme position within the elongated slot 28. This action will move the front portion 20 of the tab 10 away from an edge of the shelf 34.

Figure 9:
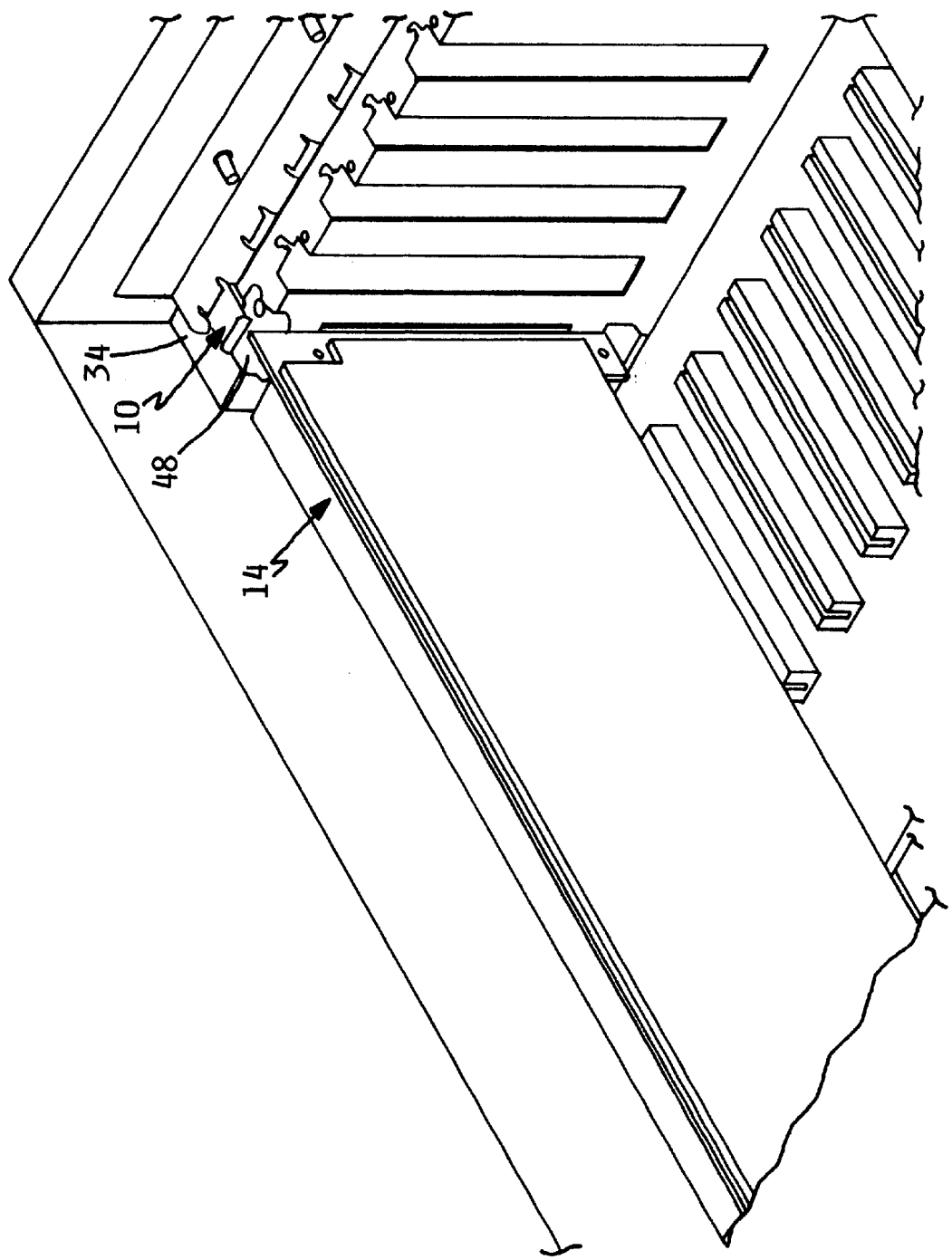
FIG. 9 is a perspective partial view of the configuration shown in FIG. 1, illustrating the circuit board engaged with the backplane.
Figure 10:
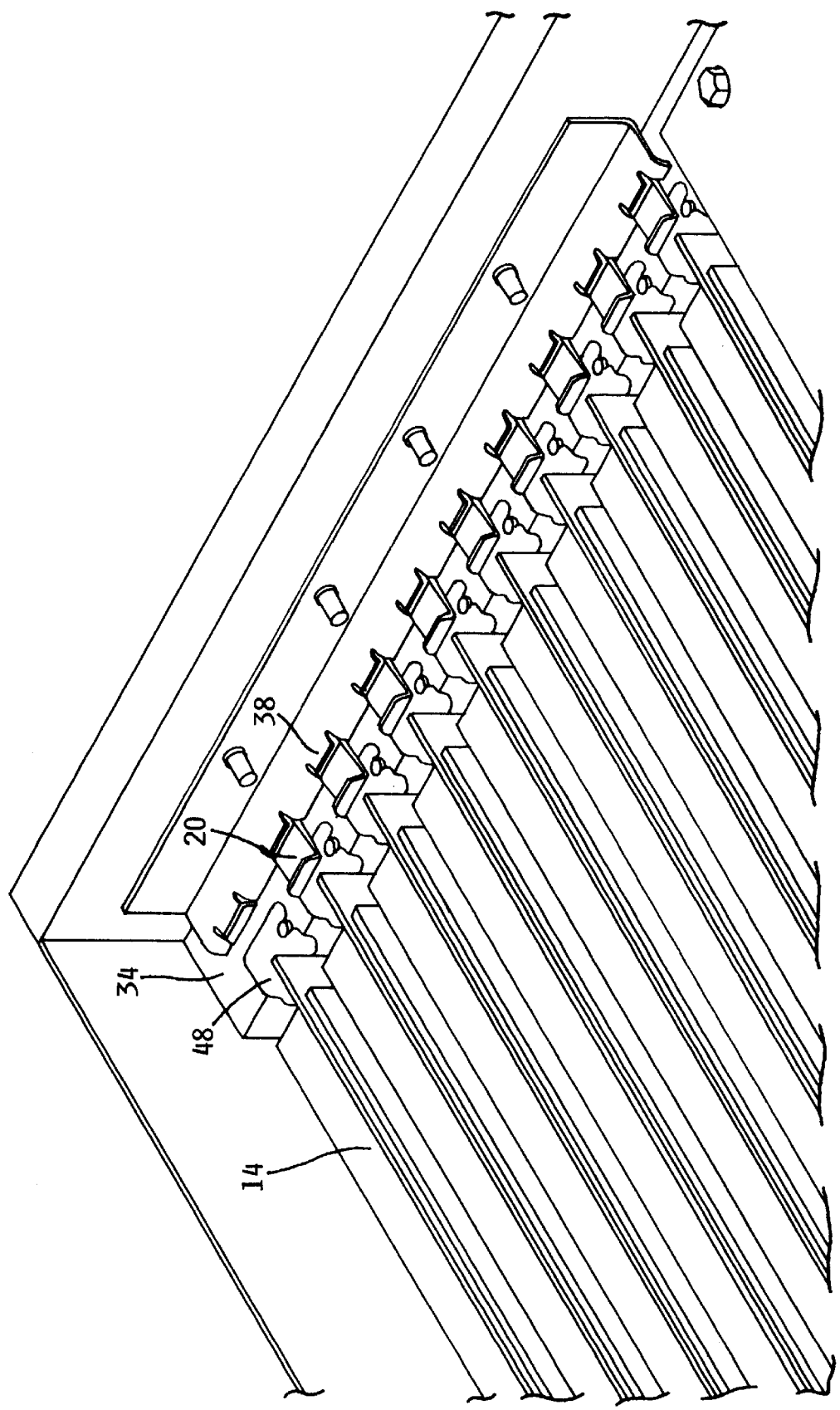
FIG. 10 is a perspective partial view of the configuration shown in FIG. 1, illustrating a plurality of the circuit boards secured in accordance with the present invention.
Figure 11:
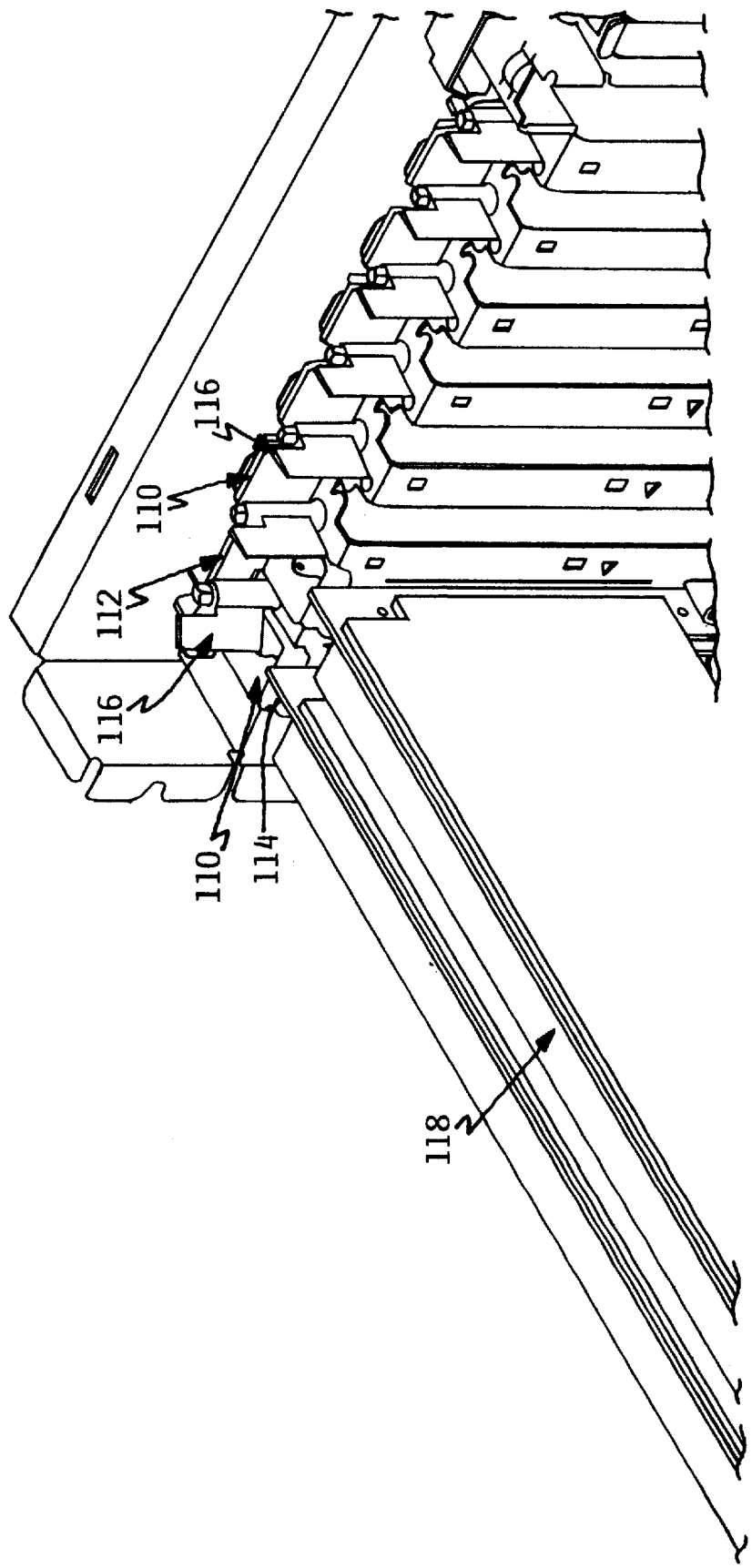
FIG. 11 is a perspective partial view of a conventional tool-less configuration for securing a circuit board within a chassis.

Referring also to FIGS. 9 and 10, the circuit board 14, which is provided with a conventional tailstock 44, is then inserted into a corresponding card slot 46 on the backplane 16. When the circuit board 14 is fully inserted (but not yet secured), as shown in the far left of FIG. 10, an upper flange portion 48 of the tailstock 44 will rest flush on the shelf 34 and in front of the front portion 20 of the sliding tab 10.

Thereafter, the sliding tab 10 is pushed in a maximum amount, i.e., until the retaining tab 30 is located at a second extreme position within the elongated slot 28. During this operation, the front portion 20 of the sliding tab 10 will slide over the upper flange portion 48 of the tailstock 44 while contacting the lower leg portion 38 of the bracket 36.

Simultaneously, due to the sloping configuration of the front portion 20 of the sliding tab 10, as the sliding tab is pushed in, the engagement between the front portion and the lower leg portion 38 of the bracket 36 will cause the front portion 20 of the sliding tab 10 to be urged, with a progressively increasing force, downward and toward the upper flange portion 48 of the tailstock 44. When the sliding tab 10 is fully pushed in, the sliding tab will thus exert a maximum downward force against the upper flange portion 48 of the tailstock 44, thus securing the circuit board 14 to the backplane 16.

Moreover, when the sliding tab 10 is fully pushed in, the upper flange portion 48 of the tailstock 44 will be advantageously accommodated in the recessed area of the front portion 20 of the sliding tab 10, i.e., under the sliding tab. This allows the applied force to be distributed over the upper flange portion 48, rather than concentrated in only one location.

The present invention thus provides for an arrangement that will allow two mating components, such as the described circuit board and backplane, to be secured within a chassis without using threaded fasteners or tools. Moreover, due to the configuration of the sliding tab and chassis, the sliding tab is prevented from becoming inadvertently separated from the chassis. Further, since it is not necessary to remove the sliding tab from the chassis to secure or remove the printed circuit board, it is unlikely that the sliding tab will be lost or misplaced.

Furthermore, since only one moving part (i.e., the sliding tab) is utilized to secure the printed circuit board to the backplane, the present invention is simple to manufacture and relatively uncomplicated to use. Additionally, because the rear portion of the sliding tab is disposed outside of the chassis, a user can quickly determine if the circuit board is secured to the backplane, without accessing the interior of the chassis.

Moreover, a user can quickly determine if there are any empty card slots available on the backplane simply by grasping the rear portion of the sliding tab. If the sliding tab moves with some resistance, it is likely engaged with the tailstock of the printed circuit board, and it can further be assumed that the corresponding card slot is occupied. On the other hand, if the sliding tab moves freely to its extreme positions without any resistance, it can be assumed that the sliding tab is not engaging with the tailstock of the printed circuit board, and it can be further assumed that the corresponding card slot is not occupied.

It should be understood, however, that the invention is not necessarily limited to the specific arrangement and components shown and described above, but may be susceptible to numerous variations within the scope of the invention.

It will be apparent to one skilled in the art that the manner of making and using the claimed invention has been adequately disclosed in the above-written description of the preferred embodiments taken together with the drawings.

It will be understood that the above description of the preferred embodiments of the present invention are susceptible to various modifications, changes, and adaptations, and the same are intended to be comprehended within the meaning and range of equivalents of the appended claims.

What is claimed is:

1. An arrangement for securing two mating components together, comprising:

a chassis adapted to accommodate therein at least two mating components, said chassis having an opening; and a sliding tab connected to said chassis and extending through the opening so that a front portion of said sliding tab is disposed within said chassis, and a rear portion of said sliding tab is disposed outside of said chassis so as to be accessible, said sliding tab being slidable in a linear direction into and out of said chassis, wherein when said sliding tab is slid in the direction out of said chassis and into a first position, the rear portion is disposed relatively distal into the opening and the front portion is disposed relatively proximal to the opening so that one of the mating components is free to be removed from the other one of the mating components, and wherein when said sliding tab is slid in the direction into said chassis and to a second position, the rear portion is disposed relatively proximal into the opening, and the front portion is disposed relatively distal to the opening and engages with the one of the mating components to secure the one of the mating components to the other one of the mating components to prevent their separating.

2. The arrangement of claim 1, wherein when said sliding tab is slid from the first position to the second position, the front portion exerts a progressively increasing force that reaches a maximum force when said sliding tab is in the second position, the maximum force urging the one of the mating components in a direction toward the other one of the mating components.

3. The arrangement of claim 1, wherein said sliding tab includes a projecting lip on a front edge of the front portion, said projecting lip abutting against said chassis when said sliding tab is slid to the first position.

4. An arrangement for securing two mating components together, comprising:

a chassis adapted to accommodate therein at least two mating components; and a sliding tab connected to said chassis and being slidable in a linear direction into and out of said chassis, wherein when said sliding tab is slid out of said chassis and into a first position one of the mating components is free to be removed from the other one of the mating components, and wherein when said sliding tab is slid into said chassis and into a second position the one of the mating component is secured to the other one of the mating components to prevent their separating;

wherein said sliding tab includes a front portion disposed within said chassis, the front portion being engageable with the one of the mating components when said sliding tab is in the second position, said sliding tab further including a rear portion disposed outside of said chassis so as to be accessible; and wherein said chassis has an opening through which said sliding tab extends, and a shelf that supports said sliding tab.

5. The arrangement of claim 4, wherein said shelf is disposed inside said chassis so as to support the front portion of said sliding tab, said shelf being in alignment with a lower peripheral edge of the opening.

6. The arrangement of claim 4, wherein said chassis includes a retaining tab that projects across the opening, and wherein said sliding tab includes a central portion having a elongated slot, said retaining tab projecting into the elongated slot so as to guide said sliding tab in the linear direction.

7. The arrangement of claim 6, wherein said retaining tab is connected to an edge of said shelf.

8. The arrangement of claim 4, wherein said chassis includes a bracket disposed over said shelf and retaining said sliding tab against said shelf.

9. The arrangement of claim 8, wherein said bracket at least partially covers the opening.

10. The arrangement of claim 9, wherein said bracket is formed of metal, and has a lower leg portion and an upper leg portion joined to the lower leg portion to form an L-shape cross-sectional profile, said upper leg portion at least partially covering the opening to limit electromagnetic radiation emissions through the opening, said lower leg portion extending over at least part of the front portion of said sliding tab.

11. An arrangement for securing two mating components together, comprising:
 a chassis adapted to accommodate therein at least two mating components; and
 a sliding tab connected to said chassis and being slidable in a linear direction into and out of said chassis, wherein when said sliding tab is slid out of said chassis and into a first position, one of the mating components is free to be removed from the other one of the mating components, and wherein when said sliding tab is slid into said chassis and into a second position, the one of the mating components is secured to the other one of the mating components to prevent their separating;
 wherein said sliding tab includes a front portion disposed within said chassis, the front portion being engageable with the one of the mating components when said sliding tab is in the second position, said sliding tab further including a rear portion disposed outside of said chassis so as to be accessible; and
 wherein said front portion and said rear portion of said sliding tab collectively define a thin, elongated configuration, and wherein the front portion of said sliding tab is tapered in thickness away from the rear portion, so that when said sliding tab is slid from the first position to the second position, said chassis contacts the front portion to urge said sliding tab, with a progressively increasing force, against the one of the mating components.

12. The arrangement of claim 11, wherein said sliding tab further has a central portion disposed between the front portion and the rear portion, and wherein the front portion forms a step at a junction between a lower surface of the front portion and a lower surface of the central portion, whereby a recessed area is provided under the front portion for accommodating at least a portion of the one of the mating components when said sliding tab is in the second position.

13. An arrangement, comprising:
 a chassis having an opening;
 a first mating component disposed inside of said chassis;
 a second mating component, said first mating component being removably connected to said second mating component; and
 a sliding tab connected to said chassis and extending through the opening so that a front portion of said sliding tab is disposed within said chassis, and a rear portion of said sliding tab is disposed outside of said chassis so as to be accessible, said sliding tab being slidable in a linear direction into and out of said chassis, wherein when said sliding tab is slid in the direction out of said chassis and into a first position, the rear portion is disposed relatively distal into the opening and the front portion is disposed relatively proximal to the opening so that said first mating component is free to be removed from said second mating component, and wherein when said sliding tab is slid in the direction into said chassis and to a second position, the rear portion is disposed relatively proximal into the opening, and the front portion is disposed relatively distal into the opening and engages with said first mating component to secure the one of the mating components to said second mating component to prevent the removal of said first mating component from said second mating component.

14. The combination recited in claim 13, wherein said first mating component comprises a printed circuit board, and said second mating component comprises a backplane, said backplane having at least one card slot thereon for receiving said printed circuit board in a mating arrangement.

15. The combination recited in claim 14, wherein said backplane and said printed circuit board are arranged essentially perpendicular to each other.

16. The combination recited in claim 15, wherein said printed circuit board includes a tailstock, and wherein when said sliding tab is in the second position, said sliding tab engages with said tailstock to urge said printed circuit board in a direction toward said backplane.

17. An arrangement, comprising:
 a chassis;
 a first mating component disposed inside of said chassis;
 a second mating component, said first mating component being removably connected to said second mating component; and
 a sliding tab connected to said chassis and being slidable in a linear direction, into and out of said chassis, wherein when said sliding tab is slid out of said chassis and into a first position, said first mating component is free to be removed from said second mating component, and wherein when said sliding tab is slid into said chassis and into a second position, said first mating component is secured to said second mating component to prevent the removal of said first mating component from said second mating component;
 wherein said first mating component comprises a printed circuit board, and said second mating component comprises a backplane, said backplane having at least one card slot thereon for receiving said printed circuit board in a mating arrangement;
 wherein said backplane and said printed circuit board are arranged essentially perpendicular to each other;
 wherein said printed circuit board includes a tailstock, and wherein when said sliding tab is in the second position, said sliding tab engages with said tailstock to urge said printed circuit board in a direction toward said backplane; and
 wherein said chassis includes a shelf that supports said sliding tab, wherein said tailstock includes a flange that abuts against said shelf when said printed circuit board is received within the card slot, wherein said flange is received between said sliding tab and said shelf when said sliding tab is in the second position, and wherein said flange is free of contact with said sliding tab when said sliding tab is in the first position.

18. The arrangement of claim 17, wherein said sliding tab includes a front portion disposed within said chassis, the front portion being engageable with the flange when said sliding tab is in the second position, said sliding tab further including a rear portion disposed outside of said chassis so as to be accessible.

19. The arrangement of claim 18, wherein said chassis has an opening through which said sliding tab extends, said shelf being in alignment with a lower peripheral edge of the opening.

20. The arrangement of claim 19, wherein said chassis includes a bracket disposed over said shelf and retaining said sliding tab against said shelf.

21. The arrangement of claim 20, wherein said bracket at least partially covers the opening.

22. The arrangement of claim 21, wherein said bracket is formed of metal, and has a lower leg portion and an upper leg portion joined to the lower leg portion to form an L-shape cross-sectional profile, said upper leg portion at least partially covering the opening to limit electromagnetic radiation emissions through the opening, said lower leg portion extending over at least part of the front portion of said sliding tab.

23. The arrangement of claim 22, wherein said chassis includes a retaining tab that projects across the opening, and wherein said sliding tab includes a central portion disposed between the front portion and the rear portion, the central portion having an elongated slot, said retaining tab projecting into the elongated slot so as to guide said sliding tab in the linear direction.

24. The arrangement of claim 23, wherein said retaining tab is connected to an edge of said shelf.

25. The arrangement of claim 24, wherein said sliding tab includes a step at a junction between a lower surface of the front portion and a lower surface of the central portion, thereby forming a recessed area under the front portion for accommodating the flange of said tail stock when said sliding tab is in the second position.

26. A method of securing at least two mating components together, comprising: positioning a first component relative to a second component within a chassis, in an arrangement that will allow the first and second components to be mated together; and sliding a tab in a linear direction into and out of the chassis, wherein when the tab is slid out of the chassis and into a first position, the first component is free to be removed from the second component, and wherein when the tab is slid into the chassis and into a second position, the first component is secured to the second component to prevent the removal of the first component from the second component.

27. The method recited in claim 26, wherein said positioning includes positioning the first component within a classic.

28. The method recited in claim 27, wherein the first component comprises a printed circuit board, and the second component comprises a backplane, the backplane having at least one card slot thereon for receiving the printed circuit board in a mating arrangement; and wherein said positioning includes placing the printed circuit board in the at least one card slot.

29. The method recited in claim 28, wherein said sliding includes sliding the tab over a tailstock of the printed circuit board, engaging the tab with the tailstock, and urging the printed circuit board in a direction toward the backplane.

30. The method recited in claim 29, further comprising locating the tab so that a front portion of the tab is disposed within the chassis for engagement with the tailstock, and so that a rear portion of the tab is disposed outside of the chassis so as to be accessible.

31. A computer, comprising:
a housing;
a chassis disposed within said housing, said chassis having an opening, a shelf in alignment with a lower peripheral edge of the opening, a retaining tab connected to an edge of said shelf and projecting across the opening, and a metal bracket having a lower leg portion and an upper leg portion joined to the lower leg portion to form an L-shape cross-sectional profile, said upper leg portion at least partially covering the opening to limit electromagnetic radiation emissions through the opening, said lower leg portion extending over said shelf;
a printed circuit board disposed inside of said chassis, said printed circuit board having a tailstock, said tailstock having a flange positionable over said shelf;
a backplane having at least one card slot, said printed circuit board being removably connected to said backplane via said at least one card slot, said flange abutting against said shelf when said printed circuit board is fully received within the card slot; and
a sliding tab extending through the opening, and being slidable in a linear direction into and out of said chassis, wherein when said sliding tab is slid out of the chassis and into a first position, and wherein when said sliding tab is slid into said chassis and into a second position, said sliding tab including a front portion disposed within said chassis and positioned between said lower leg portion and said shelf, the front portion being engageable with the flange when said sliding tab is in the second position, said sliding tab further including a rear portion disposed outside of said chassis so as to be accessible, said sliding tab additionally including a central portion disposed between the front portion and the rear portion, the central portion having an elongated slot, said retaining tab projecting into the elongated slot so as to guide said sliding tab in the linear direction, said sliding tab further including a step at a junction between a lower surface of the front portion and a lower surface of the central portion, thereby forming a recessed area under the front portion;
wherein when said sliding tab is in the first position, said flange is free of contact with said sliding tab and said printed circuit board is free to be removed from said backplane, and
wherein when said sliding tab is in the second position, said flange is received between said sliding tab and said shelf and within the recessed area, and the front portion of said sliding tab engages with said flange to urge said printed circuit board in a direction toward said backplane thereby securing said printed circuit board to said backplane to prevent the removal of said printed circuit board from said backplane.

* * * * *